United States Patent
Dunwoody et al.

(10) Patent No.: US 8,259,450 B2
(45) Date of Patent: Sep. 4, 2012

(54) MOBILE UNIVERSAL HARDWARE PLATFORM

(75) Inventors: John Craig Dunwoody, Belmont, CA (US); Teresa Ann Dunwoody, Belmont, CA (US)

(73) Assignee: Birchbridge Incorporated, Belmont, CA (US)

( * ) Notice: Subject to any disclaimer, the term of this patent is extended or adjusted under 35 U.S.C. 154(b) by 98 days.

(21) Appl. No.: 12/840,857

(22) Filed: Jul. 21, 2010

(65) Prior Publication Data

US 2012/0019115 A1    Jan. 26, 2012

(51) Int. Cl.
*H05K 7/20* (2006.01)
*H05K 7/14* (2006.01)
*H05K 7/10* (2006.01)

(52) U.S. Cl. .......... 361/699; 361/601; 361/679.53; 361/788; 361/796; 165/104.33; 165/185; 312/223.2; 312/236; 307/12; 307/13; 307/14; 62/259.2

(58) Field of Classification Search ............ 361/679.46–679.53, 78–794, 801–803; 165/80.2, 80.4, 165/80.5, 104.33, 104.34, 185; 454/184, 454/118; 62/259.2, 238.1; 312/223.2, 223.3, 312/201, 223.1; 713/320, 323, 330, 340, 713/300; 307/12, 13, 14, 147, 149
See application file for complete search history.

(56) References Cited

U.S. PATENT DOCUMENTS

| | | | | |
|---|---|---|---|---|
| 3,675,083 A * | 7/1972 | White | ............ | 361/785 |
| 3,800,097 A * | 3/1974 | Maruscak et al. | ............ | 361/791 |
| 4,511,950 A * | 4/1985 | Bunner et al. | ............ | 361/788 |
| 4,514,746 A | 4/1985 | Lundqvist | | |
| 4,685,032 A * | 8/1987 | Blomstedt et al. | ............ | 361/803 |
| 5,006,961 A * | 4/1991 | Monico | ............ | 361/788 |
| 5,390,081 A * | 2/1995 | St. Pierre | ............ | 361/775 |
| 5,450,272 A | 9/1995 | Van Gaal et al. | | |
| 5,603,044 A * | 2/1997 | Annapareddy et al. | ....... | 710/301 |
| 5,991,163 A * | 11/1999 | Marconi et al. | ............ | 361/788 |
| 6,195,493 B1 | 2/2001 | Bridges | | |
| 6,498,716 B1 * | 12/2002 | Salinas et al. | ............ | 361/610 |
| 6,536,510 B2 | 3/2003 | Khrustalev et al. | | |
| 6,629,614 B2 | 10/2003 | Jordan | | |
| 6,836,030 B2 * | 12/2004 | Smith et al. | ............ | 307/147 |
| 7,051,215 B2 * | 5/2006 | Zimmer et al. | ............ | 713/300 |

(Continued)

OTHER PUBLICATIONS

International Search Report for International Application No. PCT/US2011/044809, mailed Jan. 31, 2012.

*Primary Examiner* — Michail V Datskovskiy
(74) *Attorney, Agent, or Firm* — Alston & Bird LLP

(57) ABSTRACT

A mobile container may include a bottom element, a top element, a front element, a back element, and two side elements defining a containment volume. The two side elements may have a length longer than a length of either the front element or the back element. The containment volume may be configured to include a plurality of rack frames. Each rack frame may include a module insertion area on a first side of the rack frame, a universal backplane area, and a power bus. The universal backplane area may be positioned on a second side of the rack frame opposite to the first side and may include at least one mounting surface configured to mount two or more backplane boards. At least two of the backplane boards may be configured to couple to two respective modules that each have at least two different functions and are insertable through the module insertion area. The at least two different functions of at least one backplane board may include rack power and management functions. The power bus may provide power to the two or more backplane boards mounted in the universal backplane area.

20 Claims, 7 Drawing Sheets

U.S. PATENT DOCUMENTS

| | | | |
|---|---|---|---|
| 7,076,592 B1 * | 7/2006 | Ykema | 710/305 |
| 7,138,733 B2 * | 11/2006 | Sanders et al. | 307/147 |
| 7,222,339 B2 * | 5/2007 | Rothman et al. | 717/168 |
| 7,278,273 B1 * | 10/2007 | Whitted et al. | 62/259.2 |
| 7,389,046 B1 | 6/2008 | Tanaka et al. | |
| 7,408,775 B2 | 8/2008 | Walz et al. | |
| 7,511,959 B2 * | 3/2009 | Belady et al. | 361/701 |
| 7,511,960 B2 * | 3/2009 | Hillis et al. | 361/702 |
| 7,551,971 B2 * | 6/2009 | Hillis | 700/90 |
| 7,552,758 B2 | 6/2009 | Garner et al. | |
| 7,597,582 B2 * | 10/2009 | Nehling et al. | 439/490 |
| 7,646,109 B2 * | 1/2010 | Belady et al. | 307/14 |
| 7,673,389 B2 | 3/2010 | Lehman et al. | |
| 7,713,068 B2 | 5/2010 | Flynn et al. | |
| 7,715,207 B2 * | 5/2010 | Behrens et al. | 361/788 |
| 7,724,513 B2 * | 5/2010 | Coglitore et al. | 361/679.47 |
| 7,738,251 B2 * | 6/2010 | Clidaras et al. | 361/701 |
| 7,852,627 B2 * | 12/2010 | Schmitt et al. | 361/695 |
| 7,854,652 B2 * | 12/2010 | Yates et al. | 454/184 |
| 7,856,838 B2 * | 12/2010 | Hillis et al. | 62/259.2 |
| 7,894,945 B2 * | 2/2011 | Hillis | 700/276 |
| 7,907,409 B2 | 3/2011 | Wyatt et al. | |
| 7,952,023 B2 | 5/2011 | Caveney et al. | |
| 7,983,194 B1 | 7/2011 | Genetti et al. | |
| 7,990,710 B2 * | 8/2011 | Hellriegel et al. | 361/699 |
| 8,047,904 B2 * | 11/2011 | Yates et al. | 454/118 |
| 8,077,457 B2 * | 12/2011 | Gauthier et al. | 361/690 |
| 2003/0112582 A1 | 6/2003 | Sanders et al. | |
| 2004/0221604 A1 | 11/2004 | Ota et al. | |
| 2005/0021847 A1 | 1/2005 | Rothman et al. | |
| 2005/0213306 A1 | 9/2005 | Vos et al. | |
| 2006/0082263 A1 * | 4/2006 | Rimler et al. | 312/201 |
| 2008/0055846 A1 * | 3/2008 | Clidaras et al. | 361/687 |
| 2008/0094797 A1 * | 4/2008 | Coglitore et al. | 361/687 |
| 2008/0205003 A1 | 8/2008 | Belady | |
| 2008/0259555 A1 | 10/2008 | Bechtolsheim et al. | |
| 2009/0126910 A1 | 5/2009 | Campbell et al. | |
| 2009/0159241 A1 | 6/2009 | Lipp et al. | |
| 2009/0229194 A1 * | 9/2009 | Armillas | 52/79.1 |
| 2009/0301123 A1 * | 12/2009 | Monk et al. | 62/259.2 |
| 2010/0020806 A1 | 1/2010 | Vahdat et al. | |
| 2010/0051563 A1 * | 3/2010 | Schreiber | 211/26 |
| 2010/0165565 A1 * | 7/2010 | Hellriegal et al. | 361/679.46 |
| 2010/0254096 A1 | 10/2010 | Kim et al. | |
| 2011/0119344 A1 | 5/2011 | Eustis | 709/213 |
| 2011/0157829 A1 * | 6/2011 | Wormsbecher et al. | 361/701 |
| 2011/0175498 A1 * | 7/2011 | Bash et al. | 312/107 |
| 2011/0175499 A1 * | 7/2011 | Zhao et al. | 312/198 |
| 2011/0239680 A1 * | 10/2011 | Dechene et al. | 62/259.2 |

* cited by examiner

MOBILE UNIVERSAL HARDWARE PLATFORM

RELATED APPLICATION

This application is related to U.S. patent application Nos. 12/840,788, 12/840,808, 12/840,824, 12/840,842, and 12/840,871, each of which was filed Jul. 21, 2010, and each of which are incorporated herein by reference in their entirety.

FIELD

One embodiments of the present invention may relate to providing a universal hardware platform that is mobile.

BACKGROUND

Current standard rack configurations are measured in rack-units (RUs). For example, a blade server may have a rack unit measuring 19 inches wide and having a pitch of 1.75 inches in height. A common computer rack form-factor is 42 RU high, which is a factor in limiting the density or number of components directly mountable into a rack. Higher density component systems are desirable since they require less space per rack enclosure and ultimately less space within the building housing the enclosures. Often these buildings must include high price high maintenance false floors to accommodate the mass of cabling and the delivery of chilled air and power to the enclosures. Another factor in determining component density is the pitch of the rack unit as often limited by the space required for component heat sinks and associated cooling components (e.g., fans).

Of particular concern is the cooling of the rack's components. During operation, the electrical components produce heat, which a system must displace to ensure the proper functioning of its components. In addition to maintaining normative function, various cooling methods, such as liquid or air cooling, are used to either achieve greater processor performance (e.g., overclocking), or to reduce the noise pollution caused by typical cooling methods (e.g., cooling fans and heat sinks). A frequently underestimated problem when designing high-performance computer systems is the discrepancy between the amount of heat a system generates, particularly in high performance and high density enclosures, and the ability of its cooling system to remove the heat uniformly throughout the rack enclosure.

Due to the power requirements and heat removal requirements that often accompany standard blade servers, server banks are typically connected to fixed power and cooling sources and are therefore immobile. However, certain use cases may require significant processing and storage capabilities to be mobile. Alternatively, certain locations at which processing and storage capabilities may be needed could be relatively remote. Thus, it may be difficult to provide adequate processing and storage capabilities for certain applications.

SUMMARY

Embodiments of the present invention may provide an efficient way to cool and power components housed in a rack system. Thus, not only may more components be cooled for less cost and with less complexity, but very robust processing and storage capabilities may be provided in relatively smaller spaces. These advances may enable some embodiments having significant capability to be provided in a mobile environment.

In an exemplary embodiment, a mobile processing system is provided. The mobile processing system may include a mobile container. The mobile container may include a bottom element, a top element, a front element, a back element, and two side elements defining a containment volume. The two side elements may have a length longer than a length of either the front element or the back element. The containment volume may be configured to include a plurality of rack frames. Each rack frame may include a module insertion area on a first side of the rack frame, a universal backplane area, and a power bus. The universal backplane area may be positioned on a second side of the rack frame opposite to the first side and may include at least one mounting surface configured to mount two or more backplane boards. At least two of the backplane boards may be configured to couple to two respective modules that each have at least two different functions and are insertable through the module insertion area. The at least two different functions of at least one backplane board may include rack power and management functions. The power bus may provide power to the two or more backplane boards mounted in the universal backplane area.

In another exemplary embodiment, a mobile container is provided. The mobile container may include a bottom element, a top element, a front element, a back element, and two side elements defining a containment volume. The two side elements may have a length longer than a length of either the front element or the back element. The containment volume may be configured to include a plurality of rack frames. Each rack frame may include a module insertion area on a first side of the rack frame, a universal backplane area, and a power bus. The universal backplane area may be positioned on a second side of the rack frame opposite to the first side and may include at least one mounting surface configured to mount two or more backplane boards. At least two of the backplane boards may be configured to couple to two respective modules that each have at least two different functions and are insertable through the module insertion area. The at least two different functions of at least one backplane board may include rack power and management functions. The power bus may provide power to the two or more backplane boards mounted in the universal backplane area.

BRIEF DESCRIPTION OF THE DRAWINGS

The present invention is illustrated by way of example, and not by way of limitation, in the figures of the accompanying drawings in which.

DETAILED DESCRIPTION

Although an embodiment of the present invention has been described with reference to specific example embodiments, it will be evident that various modifications and changes may be made to these embodiments without departing from the broader spirit and scope of the invention. Accordingly, the specification and drawings are to be regarded in an illustrative rather than a restrictive sense.

Embodiments of the present invention generally relate to an architecture for a scalable modular data system. In this regard, embodiments of the present invention relate to a rack system (e.g., rack system 10) that may contain a plurality of service units or modules. The rack system described herein provides physical support, power, and cooling for the service units or modules contained therein. The rack system also provides a set of interfaces for the service units or modules including mechanical, thermal, electrical, and communication protocol specifications. Moreover, the rack system described herein may be easily networked with a plurality of instances of other rack systems to create the highly scalable modular architecture referenced above.

Each service unit or module that may be housed in the rack system provides some combination of processing, storage, and communication capacity enabling the service units to provide functional support for various computing, data processing and storage activities (e.g., as servers, storage arrays, network switches, etc.). However, embodiments of the present invention provide a mechanical structure for the rack system and the service units or modules that provides for efficient heat removal from the service units or modules in a compact design. Thus, the amount of processing capability that can be provided for a given amount of energy consumption may be increased.

Figure 1:
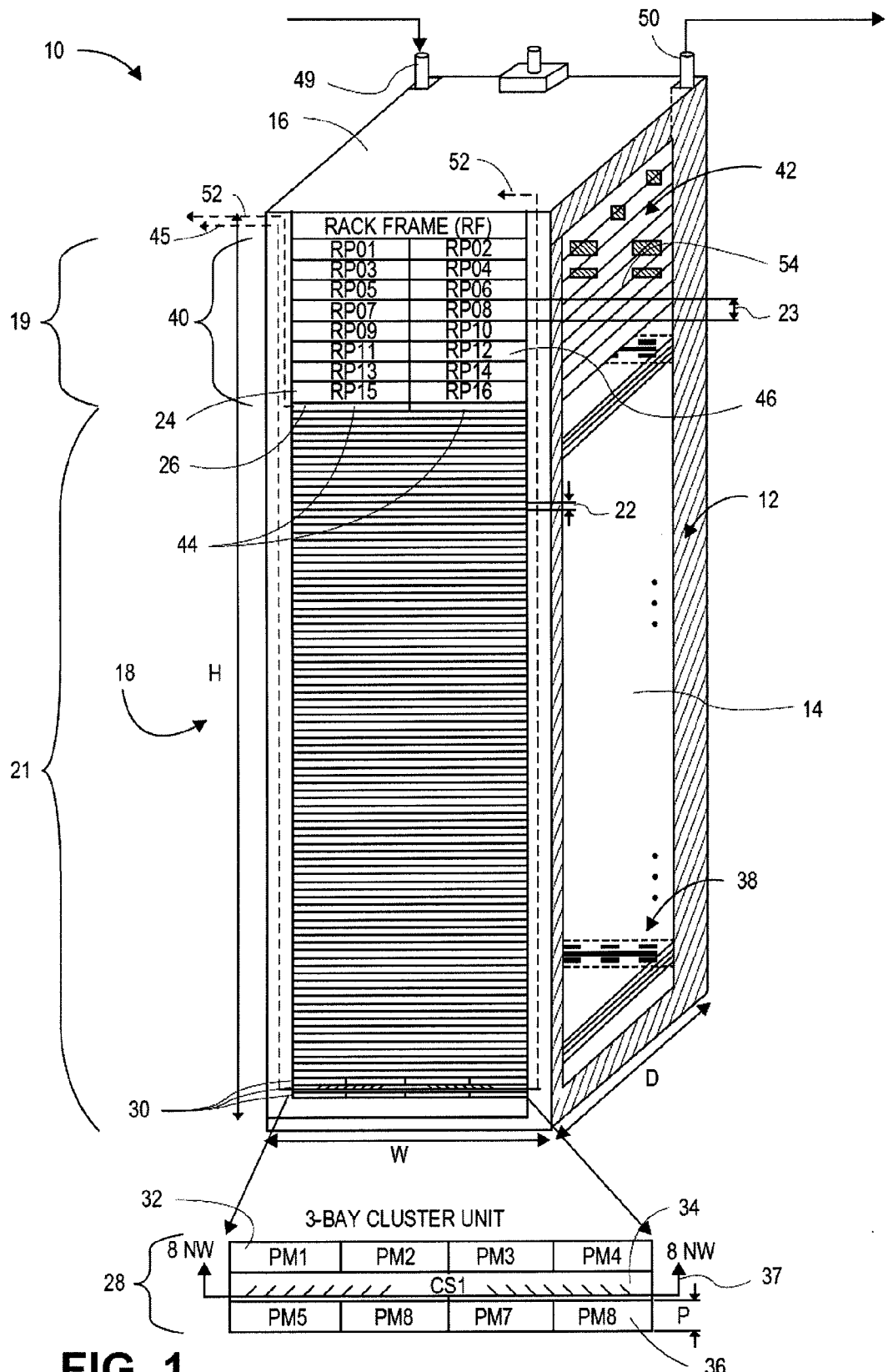
FIG. 1 illustrates an embodiment of a rack system including a cooled universal hardware platform.

FIG. 1 illustrates an embodiment of a rack system 10. Rack system 10 includes a rack power section 19 and a universal hardware platform 21. The universal hardware platform 21 includes a universal backplane mounting area 14. The rack system 10 has a perimeter frame 12 having a height 'H' width 'W' and depth 'D.' In one embodiment, the perimeter frame 12 includes structural members around the perimeter of the rack system 10 and is otherwise open on each vertical face. In other embodiments some or all of the rack's faces or planes may be enclosed, as illustrated by rack top 16.

The front side of the rack, rack front 18, may include a multitude of cooled partitions substantially parallel to each other and at various pitches, such as pitch 22 (P), where the pitch may be equal to the distance between the first surface of one cooled partition to the second surface of an adjacent cooled partition. The area or volume between each partition defines a module bay, such as module bay 24 or module bay 26. Each module bay may have a different size based on their respective pitches, such as pitch 22 corresponding to module bay 26 and pitch 23 corresponding to module bay 24. It can be appreciated that the pitch may be determined any number of ways, such as between the mid lines of each partition or between the inner surfaces of two consecutive partitions. In one embodiment, the pitch 22 is a standard unit of height, such as 0.75 inches, and variations of the pitch, such as pitch 23, may be a multiple of the pitch 23. For example, pitch 23 is two times the pitch 22, where pitch 22 is the minimum pitch based on module or other design constraints.

The rack system 10, and specifically the universal hardware platform 21, may be configured to include a multitude of service units. Each service unit may provide a combination of data processing capacity, data storage capacity, and data communication capacity. In one embodiment the rack system 10 provides physical support, power, and cooling for each service unit that it contains. A service unit and its corresponding service unit backplane correspond to a rack unit model. The rack unit model defines a set of interfaces for the service unit, which include mechanical, thermal, electrical, and communication-protocol specifications. Thus, any service unit that conforms to the interfaces defined by a particular rack unit model may be installed and operated in a rack system that includes the corresponding service unit backplane. For example, the service unit backplane mounts vertically to the universal backplane mounting area 14 and provides the connections according to the rack unit model for all of the modules that perform the functions of the service unit.

Cluster unit 28 is an example of a service unit configured to provide processing and switching functions to sixteen data nodes. In this embodiment, the cluster unit 28 spans over three module bays, module bays 30, and includes eight processing modules and a cluster switch. Specifically, the cluster unit 28 includes the four processing modules 32 (PM1-PM4) in the first module bay, a cluster switch 34 (CS1) in the second module bay, and the remaining processing modules 36 (PM5-PM8) in the third module bay.

Each of these modules may slide into their respective slots with the module bay and connect into a service unit backplane, such as cluster unit backplane 38. The cluster unit backplane 38 may be fastened to the perimeter frame 12 in the universal backplane mounting area 14. The combination of the cluster switch 34 and the cluster unit backplane 38 in this embodiment has the advantage of signal symmetry, where the signal paths of the processing modules 32 and 36 are equidistant to the cluster switch 34.

In one embodiment, the cluster switch 34 has 8 network lines exiting out of the front of the cluster switch 34 at a forty-five degree angle toward each side of the rack front 18, see for example network lines 37. For simplicity, only one cluster switch (e.g., cluster switch 34) is shown, however it can be appreciated that a multitude of cluster switches may be included in the rack system 10. Thus, the network lines for every installed cluster switch may run up the perimeter frame 12 and exit the rack top 16 in a bundle, as illustrated by net 52.

In various embodiments, some or all of the service units, such as the cluster unit 28 including the processing modules 32 and the cluster switch 34, are an upward-compatible enhancement of mainstream industry-standard high performance computing (HPC)-cluster architecture, with x86_64 instruction set architecture (ISA) and standard Infiniband networking interconnects. This enables one hundred percent compatibility with existing system and application software used in mainstream HPC cluster systems and is immediately useful to end-users upon product introduction, without extensive software development or porting. Thus, implementation of these embodiments includes using commercial off the shelf (COTS) hardware and firmware whenever possible, and does not include any chip development or require the development of complex system and application software. As a result, these embodiments dramatically reduce the complexity and risk of the development effort, improve energy efficiency, and provide a platform to enable application development for concurrency between simulation and visualization computing to thereby reducing data-movement bottlenecks.

The efficiency of the architecture of the embodiments applies equally to all classes of scalable computing facilities, including traditional enterprise-datacenter server farms, cloud/utility computing installations, and HPC clusters. This broad applicability maximizes the ability for significant improvements in energy and environmental efficiency of computing infrastructures. However, it should be noted that custom circuit and chip designs could also be used in the disclosed rack system design, but would not likely be as cost effective as using COTS components.

Returning to the discussion of FIG. 1, the cluster unit backplane 38 may be a single circuit board with connectors corresponding to their counterpart connectors on each module of the cluster unit 28, and the cluster unit backplane 38 may have a height of approximately the height of the (three) module bays 30. In other embodiments, the cluster unit backplane 38 may be composed of two or more circuit boards with corresponding connectors, or the cluster unit backplane 38 may be single circuit board that supports two or more cluster units (e.g., cluster unit 28) over a multitude of module bays.

The optional rack power section 19 of the rack system 10 may include rack power and management unit 40 composed of two rack management modules 44 and a plurality of rack power modules 46 (e.g., RP01-RP16). In another embodiment, the rack management modules 44 and a corresponding rack management backplane (not shown) may be independent of the rack power unit 40 and may be included in the universal hardware platform 21. In one embodiment, there may be two modules per module bay, such as the two rack power modules in module bay 24 and the two rack management modules 44 in module bay 26.

The rack management modules 44 may provide network connectivity to every module installed in the rack system 10. This includes every module installed in the universal hardware platform 21 and every module of the rack power section 19. Management cabling 45 provides connectivity from the rack management modules 44 to devices external to the rack system 10, such as networked workstation or control panel (not shown). This connectivity may provide valuable diagnostic and failure data from the rack system 10 and in some embodiments provide an ability to control various service units and modules within the rack system 10.

As with the backplane boards of the universal hardware platform 21, the back plane area corresponding to the rack power section 19 may be utilized to fasten one or more backplane boards. In one embodiment, a rack power and management backplane 42 is a single backplane board with connectors corresponding to their counterpart connectors on each of the rack management modules 44 and the rack power modules 46 of the rack power and management unit 40. The rack power and management backplane 42 may then have a height of approximately the height of the collective module bays corresponding to the rack power and management unit 40. In other embodiments, the rack power and management backplane 42 may be composed of two or more circuit boards with corresponding connectors.

In one embodiment, the rack power modules 46 are connected to the power inlet 48 (See e.g., FIGS. 2 and 3), which may be configured to receive three-phase alternating current (AC) power from a source external to the rack system 10. The rack power modules 46 convert the three-phase AC into direct current (DC). For example, the rack power modules 46 may convert a 480 volt three-phase AC input to 380 volt DC for distribution in the rack system 10. In one embodiment, the DC voltage from the rack power modules 46 is connected to power bus 67 (See e.g., FIGS. 2 and 3) running down from the rack power and management backplane 42 to other service unit backplanes, such as the cluster unit backplane 38.

The rack system 10 may include a coolant system having a coolant inlet 49 and coolant outlet 50. The coolant inlet 49 and the coolant outlet 50 are connected to piping running down through each partition's coolant distribution nodes (e.g., coolant distribution node 54) to provide the coolant into and out of the cooled partitions. For example, coolant (refrigerant R-134a) flows into the coolant inlet 49, through a set of vertically spaced, 0.1 inch thick horizontal cooled partitions (discussed below with reference to FIGS. 3 and 4) and out of the coolant outlet 50. The coolant may be provided, for example, from a building chiller unit. As discussed above, the space between each pair of adjacent cooled partitions is a module bay. Waste heat is transferred via conduction, first from the components within each module (e.g., processing modules 32) to the module's top and bottom surfaces, and then to the cooled partitions at the top and bottom of the module bay (e.g., module bays 30). Other coolant distribution methods and hardware may also be used without departing from the scope of the embodiments disclosed herein.

Thus, embodiments of the rack system 10 including one or all of the compact features based on modularity, cooling, power, pitch height, processing, storage and networking provide, among others, energy efficiency in system manufacturing, energy efficiency in system operation, cost efficiency in system manufacturing and installation, cost efficiency in system maintenance, space efficiency of system installations, and environmental impact efficiency throughout the system lifecycle.

Figure 2:
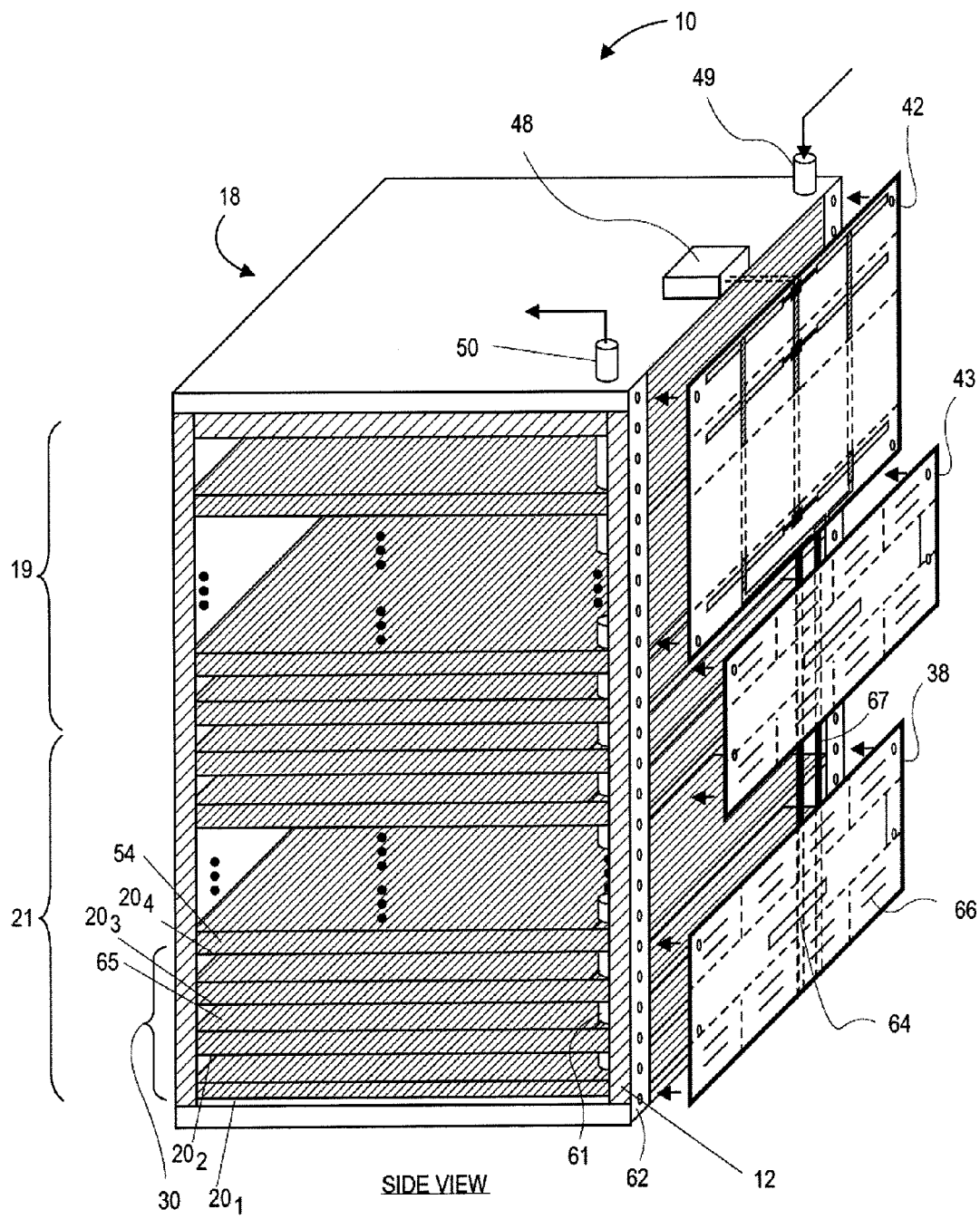
FIG. 2 illustrates a portion of the side of the rack system and the cooled universal hardware platform, according to one embodiment.

FIG. 2 illustrates a portion of the side of the rack system 10, according to one embodiment. FIG. 2 shows the rack power section 19 and the universal hardware platform 21 as seen form an open side and rear perspective of the rack system 10. The three module bays of the module bays 30 are made up of four cooled partitions, cooled partitions $20_1$, $20_2$, $20_3$, and $20_4$. Each module bay includes two partitions, in this embodiment an upper and a lower partition. For example, module bay 65 is the middle module bay of the three module bays, module bays 30, and has cooled partition $20_2$ as the lower cooled partition and $20_3$ as the upper cooled partition. As will be discussed in further detail below, functional modules may be inserted into module bays, such as module bay 65, and thermally couple to the cooled partitions to cool the modules during operation.

The coolant distribution node 54 is illustrated on cooled partition $20_4$, and in this embodiment, is connected to the coolant distribution nodes of other cooled partitions throughout the rack via coolant pipe 61 running up the height of the rack and to the coolant outlet 50. Similarly, coolant pipe 63 (See e.g., FIG. 5) is connected to the opposite end of each of the cooled partitions at a second coolant distribution node and the coolant inlet 49.

The perimeter frame 12 of the rack system 10 may include a backplane mounting surface 62 where the service unit backplanes are attached to the perimeter frame 12, such as the cluster unit backplanes 38 and 43 of the universal hardware platform 21, and the rack power and management backplane 42 of the rack power section 19. In various embodiments, the backplane mounting surface 62 may include mounting structures that conform to a multiple of a standard pitch size (P), such as pitch 22 shown in FIG. 1. The mounting structures on the surface of the service unit backplanes as well as the backplanes themselves may be configured to also conform with the standard pitch size. For example, the cluster unit backplane 38 may have a height of approximately the height of module bays 30 corresponding to a pitch of 3P, and accordingly the structures of the backplane mounting surface 62 are configured to align with the mounting structures of the cluster unit backplane 38.

In various embodiments, the mounting structures for the backplane mounting surface 62 and the service units (e.g., cluster unit 28) may be magnetic, rails, indentations, protrusions, bolts, screws, or uniformly distributed holes that may be threaded or configured for a fastener (e.g., bolt, pin, etc.) to slide through, attach or snap into. Embodiments incorporating the mounting structures set to a multiple of the pitch size have the flexibility to include a multitude of backplanes corresponding to various functional types of service units that may be installed into the module bays of the universal hardware platform 21 of the rack system 10.

When mounted, the service unit backplanes provide a platform for the connectors of the modules (e.g., processing modules 36 of service unit 28) to couple with connectors of the service unit backplane, such as the connectors 64 and 66 of the cluster unit backplane 38 and the connectors associated with the modules of cluster unit 28 described above. The connectors are not limited to any type and may be, for example, an edge connector, pin connector, optical connector, or any connector type or equivalent in the art. Because multiple modules may be installed into a single module bay, the cooled partitions may include removable, adjustable or permanently fixed guides (e.g., flat brackets or rails) to assist with the proper alignment of the modules with the connectors of the backplane upon module insertion. In another embodiment, a module and backplane may include a guide pin and corresponding hole (not shown), respectively, to assist in module alignment.

Figure 3:
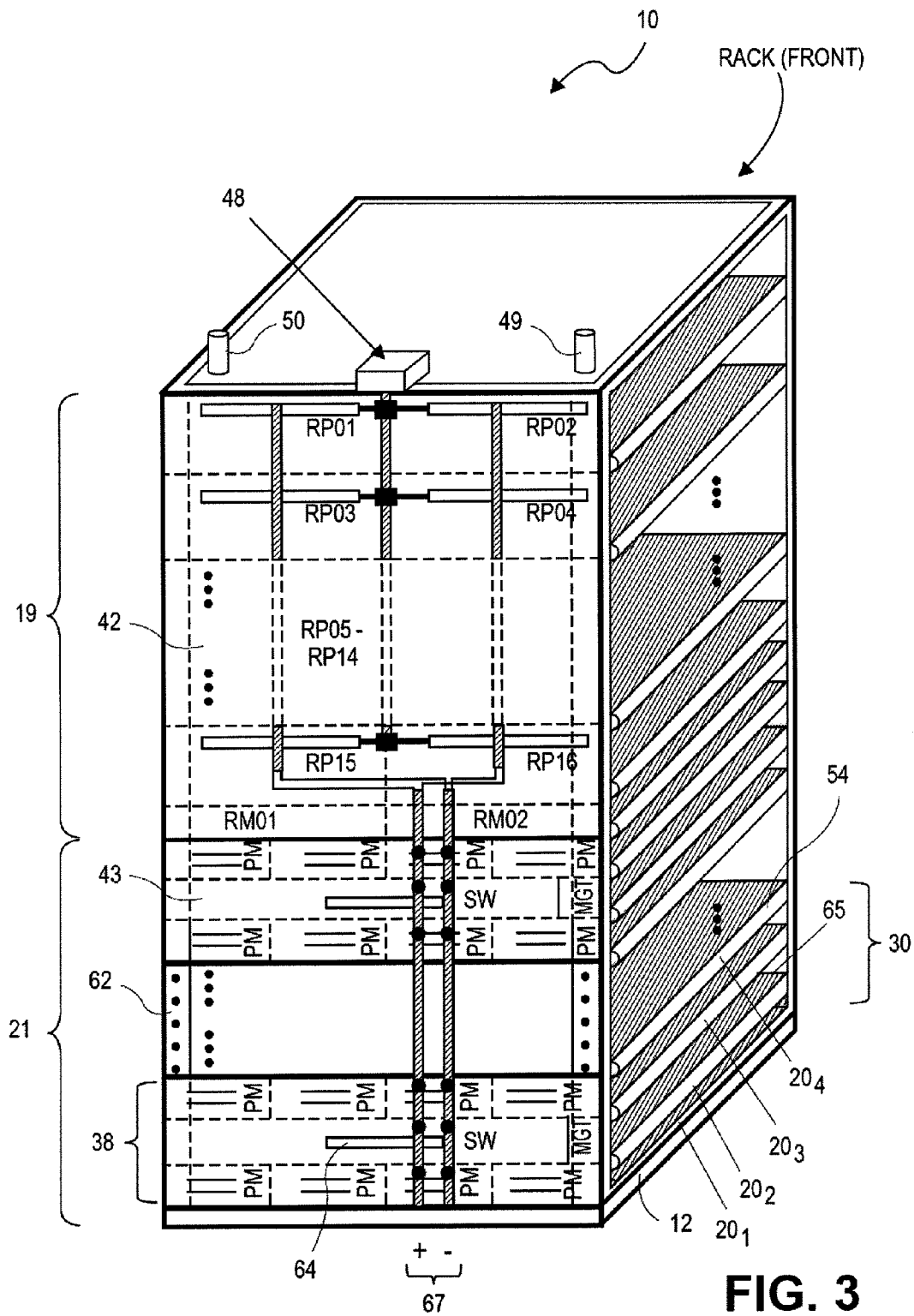
FIG. 3 illustrates an embodiment of rack system and specifically the rear portion and the open side of the rack and the cooled universal hardware platform.

FIG. 3 is an embodiment of rack system 10 illustrating the rear portion and the open side of the rack. As shown, FIG. 3 only represents a portion of the entire rack system 10, and specifically, only portions of the rack power section 19 and the universal hardware platform 21. This embodiment illustrates the power inlet 48 coupled to a power bus 67 via the rack power and management backplane 42, which as previously mentioned may convert AC power from the power inlet 48 to DC power for distribution to the service units via the service unit backplanes of the universal hardware platform 21.

In one embodiment, the power bus 67 includes two solid conductors; a negative or ground lead and a positive voltage lead connected to the rack power and management backplane 42 as shown. The power bus 67 may be rigidly fixed to the rack power and management backplane 42 or may only make electrical connection but be rigidly fixed to the backplanes as needed, such as the cluster unit backplanes 38 and 43. In another embodiment where DC power is supplied directly to the power inlet 48, the power bus 67 may be insulated and rigidly fixed to the rack system 10. Regardless of the embodiment, the power bus 67 is configured to provide power to any functional type of backplane mounted in the universal hardware platform 21. The conductors of the power bus 67 may be electrically connected to the service unit backplanes by various connector types. For example, the power bus 67 may be a metallic bar which may connect to each backplane using a bolt and a clamp, such as a D-clamp.

FIG. 3 also illustrates another view of the cooled partitions of the rack system 10. This embodiment shows the coolant distribution node 54 that is part of the cooled partitions shown, such as the cooled partitions $20_1$, $20_2$, $20_3$, and $20_4$ of module bays 30, and also shows a side view of the middle module bay, module bay 65. As discussed above, the coolant distribution node 54 may be connected to the coolant distribution nodes of the other cooled partitions via coolant pipes 61 and 63 (see e.g., FIGS. 2 and 5) running up the rack and to the coolant inlet 49 and the coolant outlet 50.

Figure 4:
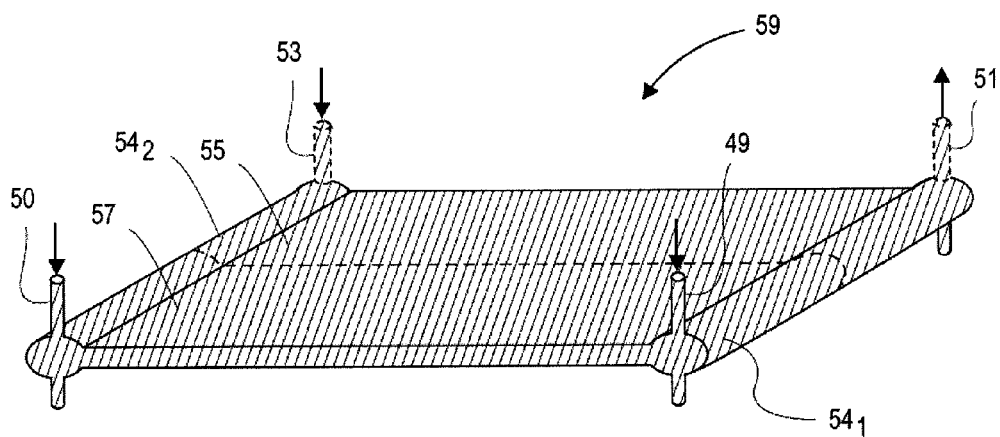
FIG. 4 illustrates an embodiment of a cooled partition found within the rack system.

FIG. 4 is an embodiment of a cooled partition 59. The cooled partition 59 includes coolant distribution nodes $54_1$ and $54_2$, which are connected to the coolant inlet 49 and the coolant outlet 50, respectively. The cooled partition 59 internally includes channels (not shown) that facilitate coolant flow between each coolant distribution node $54_1$ and $54_2$ to cool each side of the cooled partition 59. The internal channels may be configured in any suitable way known in the art, such as a maze of veins composed of flattened tubing, etc. The coolant distribution nodes $54_1$ and $54_2$ may include additional structures to limit or equalize the rate and distribution of coolant flow along the each axis of the coolant distribution node and through the cooled partition. Additionally, the coolant inlet 49 and the coolant outlet 50 may be caddy-corner or diagonal to each other depending on the rack design and the channel design through the cooled partition 59.

In another embodiment, the cooled partition 59 may be divided into two portions, partition portion 55 and partition portion 57. Partition portion 57 includes existing coolant inlet 49 and coolant outlet 50. However, the partition portion 55 includes its own coolant outlet 51 and coolant inlet 53. The partition portions 55 and 57 may be independent of each other and have their own coolant flow from inlet to outlet. For example, the coolant flow may enter into coolant inlet 49 of partition portion 57, work its way through cooling channels and out o the coolant outlet 50. Similarly, coolant flow may enter coolant inlet 53 of partition portion 55, through its internal cooling channels and out of coolant outlet 51. In another embodiment, the coolant inlet 49 and the coolant inlet 53 may be on the same side of the partition portion 55 and the partition portion 57, respectively. Having the coolant inlets and outlets on opposite corners may have beneficial cooling characteristics in having a more balanced heat dissipation throughout the cooled partition 59.

In another embodiment, the partition portions 55 and 57 are connected such that coolant may flow from one partition portion to the next either through one or both of the coolant distribution nodes $54_1$ and $54_2$ and through each partition portions' cooling channels. In this embodiment, based on known coolant flow characteristics, it may be more beneficial to have the coolant inlet 49 and the coolant inlet 53 on the same side of the partition portion 55 and the partition portion 57, and similarly the outlets 50 and 51 on the side of the partition portions 55 and 57.

Figure 5:
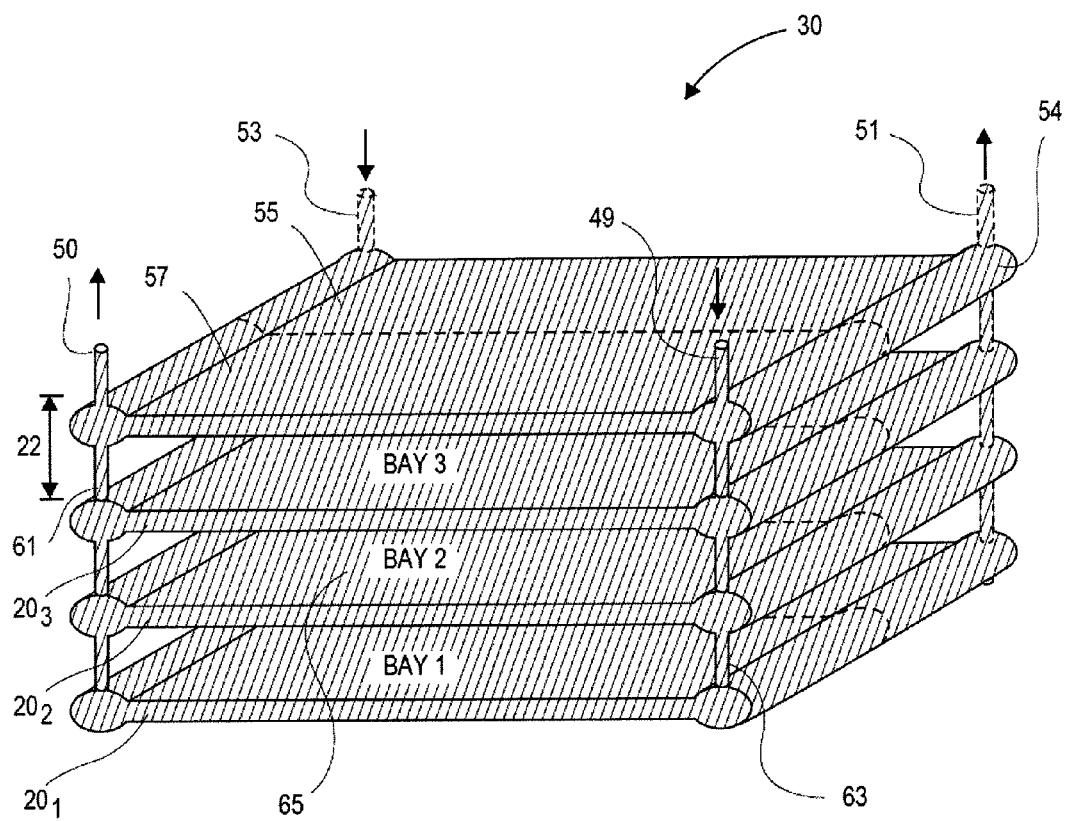
FIG. 5 illustrates an embodiment of several cooled partitions making up the module bays as viewed outside of the rack system.
Figure 6:
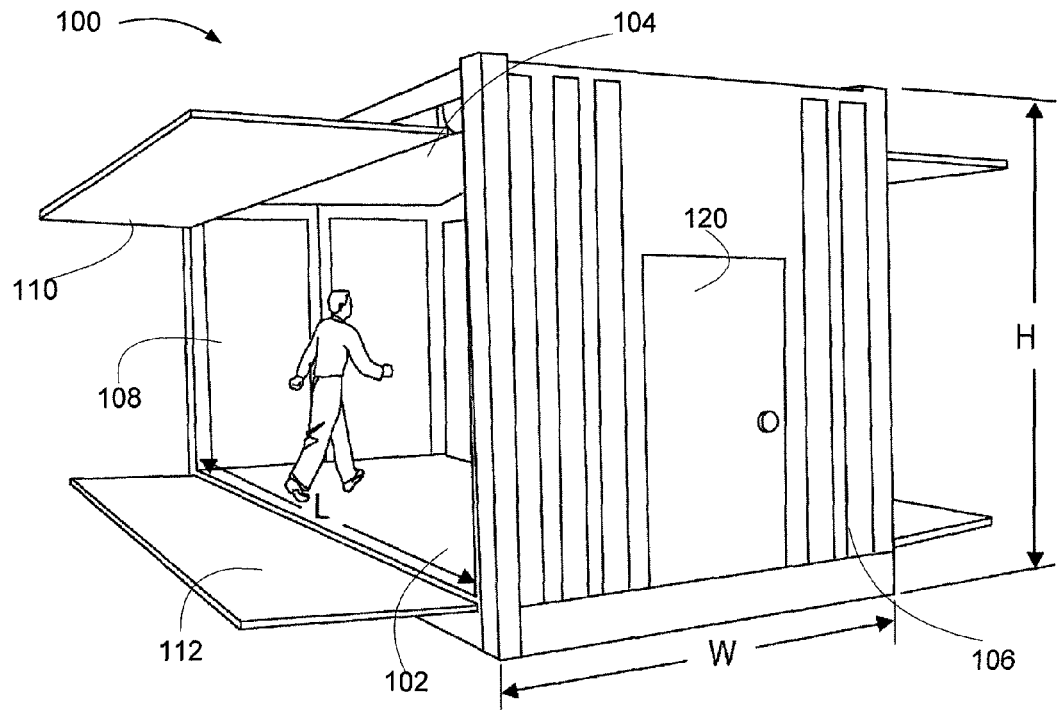
FIG. 6 illustrates a perspective view of a mobile container according to an exemplary embodiment.

FIG. 5 is an embodiment of the cooled partitions $20_1$, $20_2$, $20_3$, and $20_4$ of module bays 30 outside of the rack system 10 and provides another illustration of the module bay 65. Each cooled partition may have the same functionality as described in FIG. 4 with respect to cooled partition 59. Each cooled partition is physically connected by the coolant pipe 61 and the coolant pipe 63, which provide system wide coolant flow between all cooled partitions within the rack system 10. As with the cooling partition 59 of FIG. 4, in another embodiment the cooled partitions $20_1$, $20_2$, $20_3$, and $20_4$ may have an additional coolant outlet 51 and coolant inlet 53 and associated piping similar to coolant pipes 61 and 63. In other embodiments, the configuration of the inlets and outlets may vary depending on the desired coolant flow design. For example, the two inlets may be on opposite diagonal corners or on the same side depending on the embodiment designed to, such as including partition portions, etc., as discussed above with reference to FIG. 4.

In one embodiment, the bottom and top surfaces of the cooled partitions $20_1$, $20_2$, $20_3$, and $20_4$ are heat conductive surfaces. Because coolant flows between these surfaces they are suited to conduct heat away from any fixture or apparatus placed in proximity to or in contact with either the top or bottom surface of the cooled partitions, such as the surfaces of cooled partitions $20_2$ and $20_3$ of module bay 65. In various embodiments, the heat conductive surfaces may be composed of many heat conductive materials known in the art, such as aluminum alloy, copper, etc. In another embodiment, the heat conductive surfaces may be a mixture of heat conducting materials and insulators, which may be specifically configured to concentrate the conductive cooling to specific areas of the apparatus near or in proximity to the heat conductive surface.

Each service unit or module that may be housed in the rack system 10 provides some combination of processing, storage, and communication capacity enabling the service units to provide functional support for various computing, data processing and storage activities (e.g., as servers, storage arrays, network switches, etc.). However, embodiments of the present invention provide a mechanical structure for the rack system and the service units or modules that provides for efficient heat removal from the service units or modules in a compact design. Thus, the amount of processing capability that can be provided for a given amount of energy consumption may be increased.

As indicated above, embodiments of the present invention may enable networking of multiple rack systems 10 to provide a highly scalable modular architecture. In this regard, for example, a plurality of rack systems could be placed in proximity to one another to provide large capabilities for processing and/or storing data within a relatively small area. Moreover, due to the efficient cooling design of the rack system 10, placing a plurality of rack systems in a small area may not require additional environmental cooling requirements beyond the cooling provided by each respective rack system 10. As such, massive amounts of processing and computing power may be made available with a relatively low complexity architecture and a relatively low cost for maintenance and installation. The result may be that potentially very large energy savings can be experienced over the life of the rack systems relative to conventional data systems. Thus, embodiments of the present invention may have a reduced environmental footprint relative to conventional data systems.

Another benefit of the efficient architecture of the rack system 10 described above, which flows from the ability to interconnect multiple rack systems in a relatively small area, is that such interconnected multiple rack systems may be implemented on a mobile platform. Thus, for example, a plurality of rack systems may be placed in a mobile container such as an inter-modal shipping container. The mobile container may have a size and shape that is tailored to the specific mobile platform for which implementation is desired. Accordingly, it may be possible to provide very robust processing and storage capabilities in a modular and mobile platform.

FIGS. 6 to 9 illustrate examples of a mobile container 100 that may be implemented in connection with some exemplary embodiments. The mobile container 100 may have dimensions including length (L), height (H) and width (W) that are selected based on the mobile platform upon which the mobile container 100 is expected to be mounted for transportation. Thus, for example, dimensions of the mobile container 100 may be selected so that the mobile container 100 may fit within a cargo bay of a ship or aircraft, or fit on a flatbed rail car, automobile or semi-trailer. In some situations, the number or rack systems that are needed or desired for a specific embodiment may be a determining factor in selecting a size for the mobile container 100. As such, for example, the length of the mobile container 100 may be selected to be a multiple of the width dimension of the rack system 10.

The mobile container 100 may include side panels that may be removed or otherwise opened to enable side access to the mobile container 100 via the long dimension of the mobile container 100. The provision of side access may facilitate onloading and offloading of the rack systems disposed in the mobile container 100. In some embodiments, as shown in FIGS. 6 to 9, the mobile container 100 may include a bottom element 102, a top element 104, a front element 106, a back element 108, and two side elements or side panels. The side panels may have a length longer than the front element and the back element in some embodiments. Moreover, in some cases, at least one of the side panels or the front/back elements may include one or more access panels to permit access to the mobile container 100. In an exemplary embodiment, the side panels may include a side panel top 110 and a side panel bottom 112 that fold up and down, respectively, to enable access to the mobile container. However, in alternative embodiments, side panels may slide horizontally or swing open in opposite directions rotating about a vertical axis instead of rotating about a horizontal axis like the side panel top 110 and the side panel bottom 112 of FIGS. 6 to 9. In still other alternative embodiments, the side panels may include a single panel that swings open about a horizontal or vertical axis or that is completely removable when unlatched.

Figure 7:
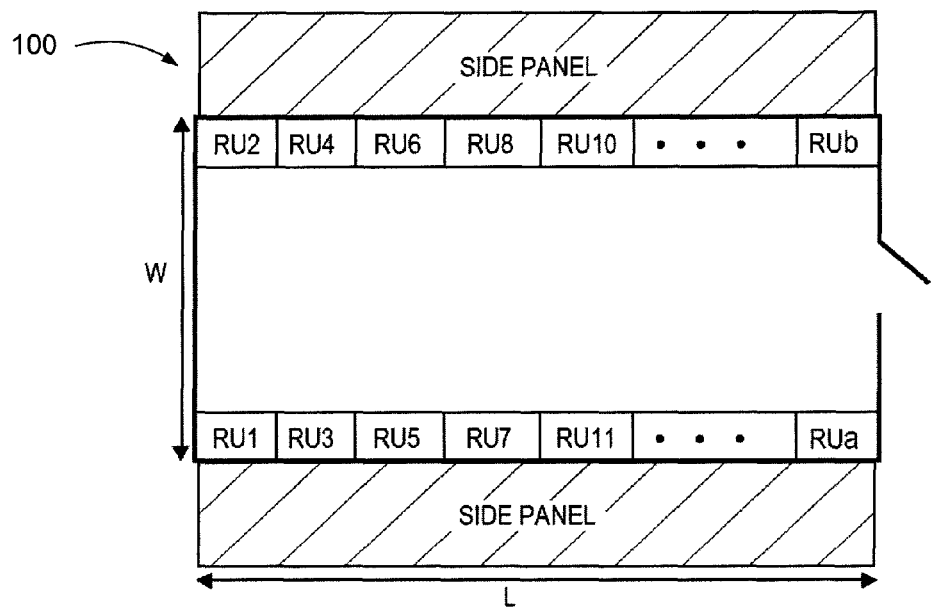
FIG. 7 illustrates a plan view of a mobile container with rack systems installed therein according to an exemplary embodiment.
Figure 8:
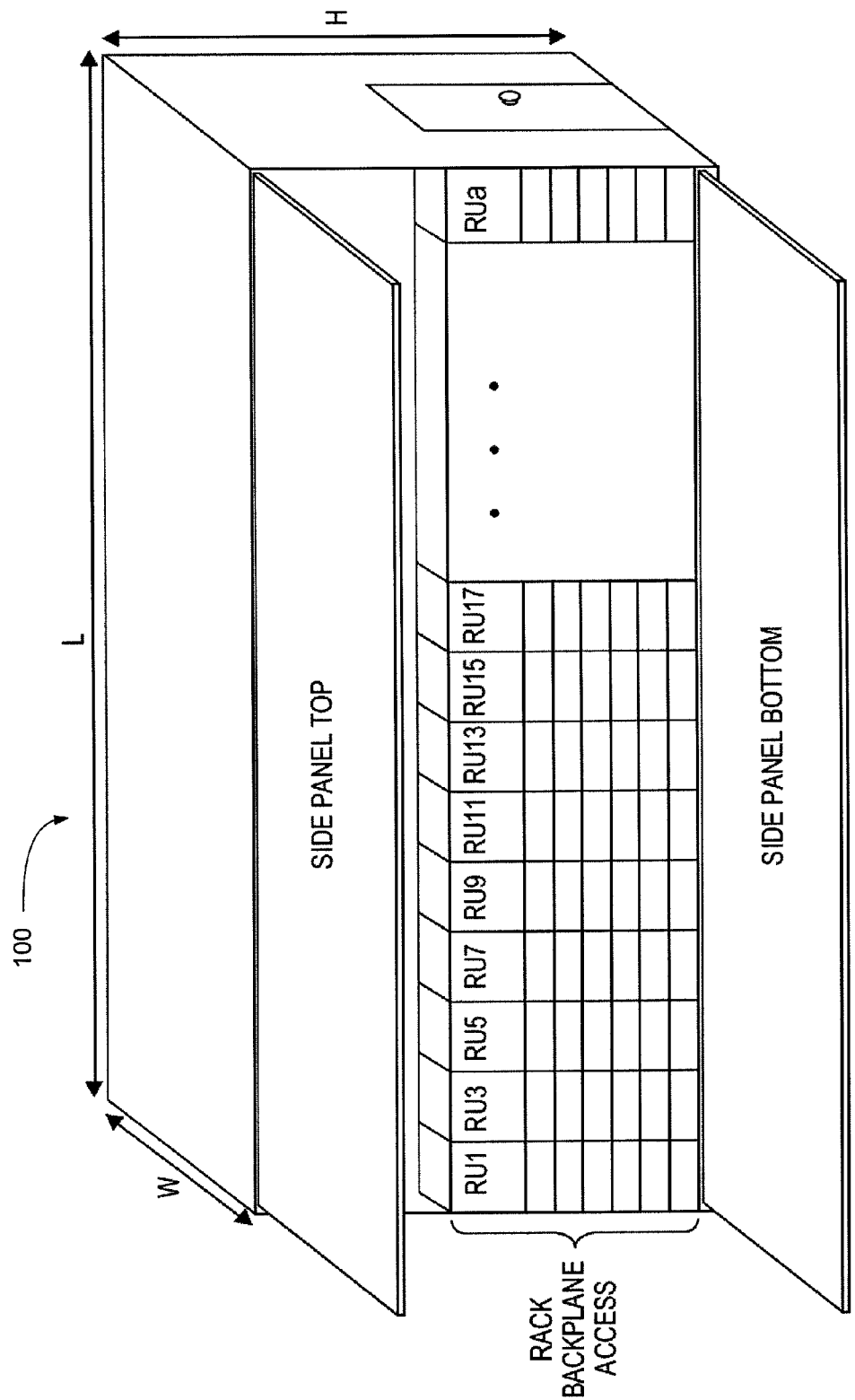
FIG. 8 illustrates a perspective view of a mobile container with rack systems provided therein according to an exemplary embodiment.

As shown in FIGS. 7 and 8, a plurality of rack systems (e.g., RU1 to RUb) may be moved into the mobile container 100 via the side access provided by the side panels. Moreover, the rack systems may be positioned such that backplane access is achievable via opened side panels as shown in FIG. 8. Thus, the rack front 18 of each rack system 10 may be accessible from the interior of the mobile container 100 after the mobile container 100 has been loaded fully with rack systems. In other words, the rack systems may be positioned in a side-by-side fashion along the interior perimeter of the length dimension of the mobile container 100 such that the rack fronts of all of the rack systems on one side of the mobile container 100 are in alignment with each other, and all of the rack fronts of all of the rack systems on the other side of the mobile container 100 are in alignment with each other as well.

When the mobile container 100 is fully loaded with rack systems, the side panels may be closed. The mobile container 100 may then be placed on a mobile platform of choice and shipped to or otherwise placed in a desirable location and placed into operation. When the side panels are closed, access to the mobile container 100 may be provided via a door 120, which may be positioned at an end of the mobile container 100. The door 120 may be used primarily for personnel access to the mobile container 100 and to the rack fronts of the rack systems lining the outside walls of the mobile container 100.

Figure 9:
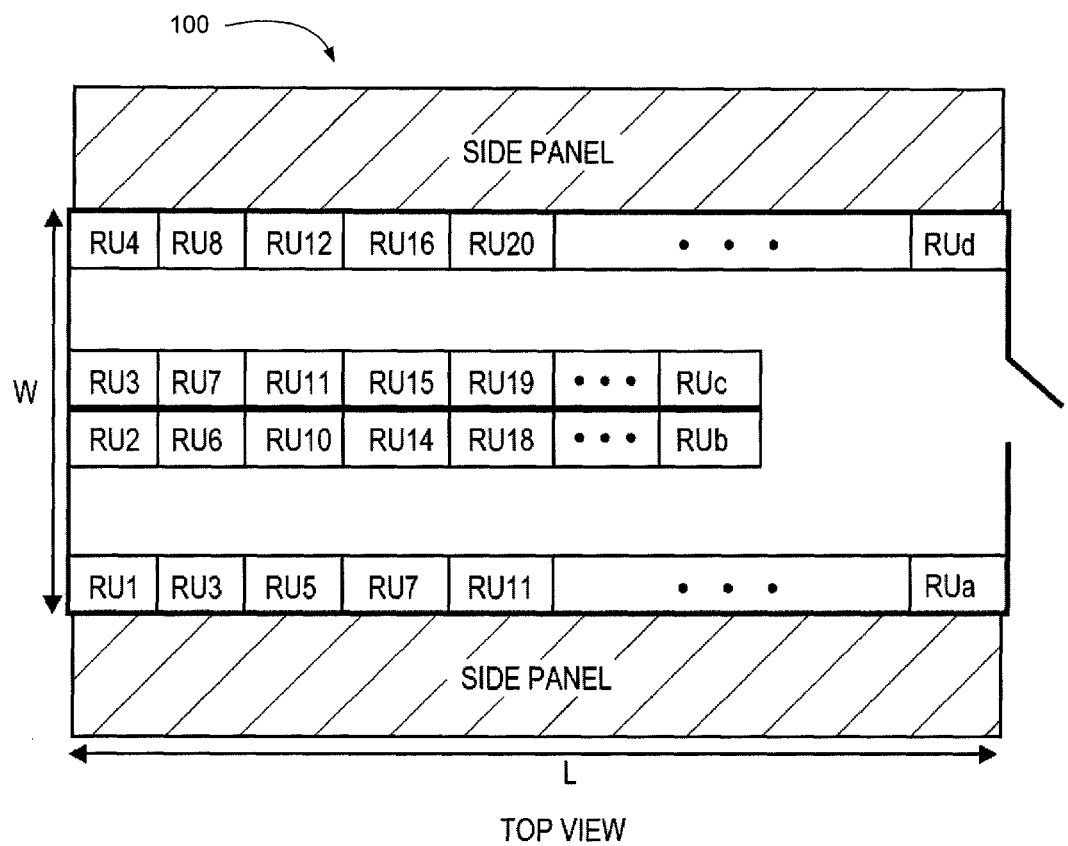
FIG. 9 illustrates an alternative plan view of a mobile container with rack systems installed therein according to an exemplary embodiment.

In some embodiments, in addition to placing rack systems along the side panels of the mobile container 100, some additional rack systems may be positioned in interior portions of the mobile container 100. FIG. 9 shows an example in which additional rows of rack systems may be provided back-to-back within the mobile container 100. By positioning rack systems in rows that are positioned back-to-back, the rack fronts of the interior positioned rack systems may also be easily accessed by personnel. The rows of rack systems may therefore define service aisles that personnel can easily walk down to conduct maintenance or other operations with respect to one or more of the rack systems and the service units located therein. The rack fronts of the interior positioned rack systems may face the rack fronts of the exterior positioned rack systems on each respective side of the mobile container 100. Such a configuration may provide for relatively easy networking of each of the rack systems as well as provide for provision of series or parallel inputs for coolant and/or electrical power to each respective rack system. For example, the overhead area of the mobile container 100 may be provided with piping and wiring systems to enable flexible wiring or tubing connections to mate from fixed piping and wiring receptacles in the mobile container 100 to one or more of the rack systems. Alternatively, the bottom element 108 may include protrusions or piping/electrical conduits for facilitating coolant and electrical connections. In this regard, a flexible hose may connect a coolant header to one or more coolant inlets and outlets (e.g., coolant inlet 49 and coolant outlet 50) of the rack systems and a flexible chord may connect a power receptacle to the power buses (e.g., power bus 67) of the rack systems to provide a three-phase power input for each rack system.

The fixed piping and/or electrical receptacles of the mobile container may form respective ones of a cooling distribution system and an electrical power distribution system housed within the mobile container 100. The cooling distribution system and the electrical power distribution system may thereafter be powered or supplied via internal or external sources. Thus, for example, a power generator and/or an electrical chilling unit may be placed in operable communication with the mobile container 100 to provide electricity and refrigeration, respectively. In other cases, an external power source and/or source of cooling may be placed in communication with the mobile container 100 to provide electricity and cooling thereto. Accordingly, the mobile container 100 may include external connections for enabling electrical power and refrigeration services to be provided to the mobile container 100 from corresponding sources that may be mobile themselves (e.g., a mobile power generator or chiller) or may be fixed on-site at the location at which the mobile container 100 is placed into service.

In some embodiments, rather than using a refrigerant or a liquid coolant to provide cooling to the rack systems, the cooling distribution system may be coupled to an airflow source. The airflow source may then be configured to provide airflow through the plurality of bays of each rack frame to cool the service units or modules therein.

Although an embodiment of the present invention has been described with reference to specific example embodiments, it will be evident that various modifications and changes may be made to these embodiments without departing from the broader spirit and scope of the invention. Accordingly, the specification and drawings are to be regarded in an illustrative rather than a restrictive sense.

The Abstract of the Disclosure is provided to comply with 37 C.F.R. §1.72(b), requiring an abstract that will allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separate embodiment.

What is claimed is:

1. A mobile processing system, comprising:
a mobile container configured to include a plurality of rack frames, each rack frame comprising:
a module insertion area on a first side of the rack frame;
a universal backplane area on a second side of the rack frame opposite to the first side, the universal backplane area including at least one mounting surface configured to mount two or more backplane boards, wherein at least two of the backplane boards are configured to couple to two respective modules each having at least two different functions and insertable through the module insertion area, the at least two different functions of at least one of the modules including rack power and management functions; and
a power bus to provide power to the two or more backplane boards mounted in the universal backplane area.

2. The mobile processing system of claim 1, wherein the mobile container is comprised of a bottom element, a top element, a front element, a back element, and two side elements, wherein the two side elements have a length longer than the front element and the back element.

3. The mobile processing system of claim 2, wherein at least one of the two side elements and the back element include one or more access panels to permit access to the backplane of at least one rack frame.

4. The mobile processing system of claim 3, wherein the plurality of rack frames are aligned next to each other along at least one side element such that the backplanes of each of the rack frames are accessible via the access panels and first sides of each of the rack frames are accessible from an interior of the mobile container.

5. The mobile processing system of claim 4, wherein the backplanes of each of the rack frames lie in a plane and wherein the first sides of each of the rack frames lie in a plane parallel to the plane in which the backplanes of each of the rack frames lie.

6. The mobile processing system of claim 1, wherein the mobile container includes a power distribution system.

7. The mobile processing system of claim 6, wherein the power distribution system is coupled to a three-phase power input and each rack frame.

8. The mobile processing system of claim 1, wherein the mobile container includes a cooling distribution system.

9. The mobile processing system of claim 8, wherein the cooling distribution system is coupled to a refrigerant source and each rack frame.

10. The mobile processing system of claim 9, wherein each frame includes a coolant system to provide coolant flow within each shelf.

11. The mobile processing system of claim 7, wherein the modules are configured to be cooled by airflow through the plurality of bays of each rack frame.

12. The mobile processing system of claim 1, including one or more service units comprised of the one or more component modules configured to connect through one or more bays to the backplane of the rack frame.

13. The mobile processing system of claim 12, wherein a first service unit of the one or more service units includes is a rack power unit comprised of one or more rack power modules to convert alternating current (AC) to direct current (DC).

14. The mobile processing system of claim 12, wherein a first service unit of the one or more service units is a cluster unit comprised of one or more processing modules and a cluster switch module.

15. The mobile processing system of claim 1, wherein a length of the mobile container corresponds to a multiple of a width of the rack frame.

16. The mobile processing system of claim 1, wherein dimensions of the mobile container are selected to correspond to dimensions of a cargo bay, a flatbed rail car, a flat bed automobile or a semi-trailer.

17. A mobile container comprising:
a bottom element, a top element, a front element, a back element, and two side elements defining a containment volume, wherein the two side elements have a length longer than the front element and the back element, and wherein the containment volume is configured to include a plurality of rack frames, each rack frame comprising:
a module insertion area on a first side of the rack frame;
a universal backplane area on a second side of the rack frame opposite to the first side, the universal backplane area including at least one mounting surface configured to mount two or more backplane boards, wherein at least two of the backplane boards are configured to couple to two respective modules each having at least two different functions and insertable through the module insertion area, the at least two different functions of at least one of the modules including rack power and management functions; and
a power bus to provide power to the two or more backplane boards mounted in the universal backplane area.

18. The mobile container of claim 17, further comprising a cooling distribution system coupled to a refrigerant source and each rack frame.

19. The mobile container of claim 17, further comprising a power distribution system coupled to a three-phase power input and each rack frame.

20. The mobile container of claim 17, wherein the plurality of rack frames are aligned next to each other along at least one side element such that the backplanes of each of the rack frames are accessible via the access panels and first sides of each of the rack frames are accessible from an interior of the mobile container.

* * * * *

UNITED STATES PATENT AND TRADEMARK OFFICE
CERTIFICATE OF CORRECTION

| | | |
|---|---|---|
| PATENT NO. | : 8,259,450 B2 | Page 1 of 1 |
| APPLICATION NO. | : 12/840857 | |
| DATED | : September 4, 2012 | |
| INVENTOR(S) | : John Craig Dunwoody et al. | |

It is certified that error appears in the above-identified patent and that said Letters Patent is hereby corrected as shown below:

Column 1

Line 13 "One" should read --Some--

Signed and Sealed this
Twenty-seventh Day of November, 2012

David J. Kappos
*Director of the United States Patent and Trademark Office*